United States Patent
Lee

(10) Patent No.: US 7,489,189 B2
(45) Date of Patent: Feb. 10, 2009

(54) POWER AMPLIFIER CIRCUIT REDUCING ELECTROMAGNETIC INTERFERENCE

(75) Inventor: Jong-Haeng Lee, Daejeon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 90 days.

(21) Appl. No.: 11/634,261

(22) Filed: Dec. 5, 2006

(65) Prior Publication Data
US 2007/0164815 A1    Jul. 19, 2007

(30) Foreign Application Priority Data
Jan. 13, 2006    (KR) .................. 10-2006-0003873

(51) Int. Cl.
*H03F 3/38*    (2006.01)
*H03F 3/217*    (2006.01)
(52) U.S. Cl. ........................................ 330/10; 330/251
(58) Field of Classification Search ............... 330/10, 330/251
See application file for complete search history.

(56) References Cited
U.S. PATENT DOCUMENTS

| 6,064,259 A * | 5/2000 | Takita ............................ 330/10 |
| 6,294,954 B1 * | 9/2001 | Melanson ........................ 330/10 |
| 2007/0030061 A1 * | 2/2007 | Cho et al. ........................ 330/10 |

FOREIGN PATENT DOCUMENTS

| KR | 1019940008285 | 9/1994 |
| KR | 1020020002020 A | 1/2002 |
| KR | 10-0340193 | 5/2002 |
| KR | 100380620 B1 | 4/2003 |

* cited by examiner

*Primary Examiner*—Steven J Mottola
(74) *Attorney, Agent, or Firm*—F. Chau & Associates, LLC

(57) ABSTRACT

A power amplifier circuit including a power transistor unit generating an output signal based on a predetermined pulse-width modulated signal. The power transistor unit includes a plurality of transistors and a delay circuit unit. The delay circuit unit sequentially drives the plurality of transistors with a predetermined time delay based on the pulse-width modulated signal.

13 Claims, 8 Drawing Sheets

POWER AMPLIFIER CIRCUIT REDUCING ELECTROMAGNETIC INTERFERENCE

CROSS-REFERENCE TO RELATED PATENT APPLICATIONS

This application claims the priority of Korean Patent Application No. 10-2006-0003873, filed on Jan. 13, 2006, in the Korean Intellectual Property Office, the disclosure of which is incorporated herein in its entirety by reference.

BACKGROUND OF THE INVENTION

1. Technical Field

The present disclosure relates to a power amplifier circuit, and more particularly, to a class-D power amplifier circuit used to amplify an audio signal.

2. Discussion of the Related Art

Class-D amplifiers are also known as digital amplifiers. Digital amplifiers convert audio signals into pulse signals, amplify the pulse signals, and output them to speakers. Class-D amplifiers include a pulse width modulation (PWM) unit which converts an audio signal into a pulse signal. The PWM unit has a comparator type circuit and outputs a predetermined sawtooth wave signal that can be compared with the audio signal. The PWM unit compares the audio signal with the sawtooth wave signal, outputs a "1" when the amplitude of the audio signal is greater than the sawtooth wave signal, and outputs a "0" when the amplitude of the audio signal is smaller than the sawtooth wave signal. Analog amplifiers which use a vacuum tube or a transistor suffer from signal distortion due to noise generated by the thermal motion of electrons and nonlinearity of an amplifier element. Furthermore, analog amplifiers have low power use efficiency. However, digital amplifiers have a high power use efficiency and thus are used more widely than analog amplifiers.

Commonly, Class-D amplifiers include a power transistor at an output terminal in order to drive current needed to transmit an output signal of a PWM unit to an external speaker. Conventional power transistors have a large rate of current variation and a large switching peak voltage due to parasitic inductance caused by a bonding wire or the like.

FIG. 1 is a circuit diagram of a conventional class-D amplifier. Referring to FIG. 1, the conventional class-D amplifier includes a power supply node 39, a first inverter IN1, a second inverter IN2, a pull-up transistor 36, and a pull-down transistor 37.

The first inverter IN1 is connected between the power supply node 39 and a ground and includes a positive-channel metal-oxide semiconductor (PMOS) transistor 31 and a negative-channel MOS (NMOS) transistor 32. The first inverter IN1 receives an output signal PMOS_IN of a PWM unit (not shown) and inverts and outputs the signal PMOS_IN. The pull-up transistor 36 is connected between the power supply node 39 and an output node OUTN and is turned on in response to an output signal of the first inverter IN1. The pull-up transistor 36 is turned on when the output signal PMOS_IN of the PWM unit is a high level and supplies current from the power supply node 39 to the output node OUTN to pull up an output signal OUTP to a supply voltage level.

The second inverter IN2 is connected between the power supply node 39 and the ground and includes a PMOS transistor 33 and an NMOS transistor 34. The second inverter IN2 receives an output signal NMOS_IN of a PWM unit (not shown) and inverts and outputs the signal NMOS_IN. The pull-down transistor 37 is connected between the output node OUTN and the ground and is turned on in response to an output signal of the second inverter IN2. The pull-down transistor 37 is turned on when the output signal NMOS_IN of the PWM unit is a low level and pulls down an output signal OUTP to a ground voltage level.

Conventionally, a ratio of a width to a length, i.e., W/L of the pull-up transistor 36 and the pull-down transistor 37 is increased to increase the amount of current per hour, whereby an increase in high output power is obtained. However, when the amount of current per hour is changed rapidly, electromagnetic interference (EMI) occurs. In conventional technology, since a switching peak voltage is large due to the switching operation of a power transistor, a large amount of harmonic components are present. Harmonic components raise electronic wave interference in peripheral circuits, causing the circuits to malfunction.

SUMMARY OF THE INVENTION

According to an exemplary embodiment of the present invention, there is provided a power amplifier circuit including a power transistor unit generating an output signal based on a predetermined pulse-width modulated signal. The power transistor unit includes a plurality of transistors and a delay circuit unit. The delay circuit unit sequentially drives the plurality of transistors with a predetermined time delay based on the pulse-width modulated signal.

The plurality of transistors may include a plurality of pull-up transistors which are sequentially turned on based on the pulse-width modulated signal and a plurality of pull-down transistors which are sequentially turned on based on the pulse-width modulated signal.

According to an exemplary embodiment of the present invention, there is provided a class-D power amplifier circuit including a plurality of first group transistors sequentially turned on or off according to a PMOS input signal based on a predetermined pulse-width modulated signal, and a plurality of second group transistors sequentially turned on or off according to an NMOS input signal based on the predetermined pulse-width modulated signal.

The PMOS input signal may be out of phase with the NMOS input signal by a predetermined angle.

According to an exemplary embodiment of the present invention, there is provided a class-D power amplifier circuit including an input gain stage unit, a pulse width modulation (PWM) unit, a first power transistor unit, and a second power transistor unit.

The input gain stage unit receives a predetermined signal and generates a first input signal and a second input signal. The pulse width modulation (PWM) unit performs PWM on the first input signal to generate first, second, third, and fourth pulse-width modulated signals. The first power transistor unit includes a plurality of first group transistors sequentially turned on or off according to the first pulse-width modulated signal and a plurality of second group transistors sequentially turned on or off according to the second pulse-width modulated signal. The first power transistor generates a first output signal. The second power transistor unit includes a plurality of third group transistors sequentially turned on or off according to the third pulse-width modulated signal and a plurality of fourth group transistors sequentially turned on or off according to the fourth pulse-width modulated signal. The first power transistor generates a second output signal.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
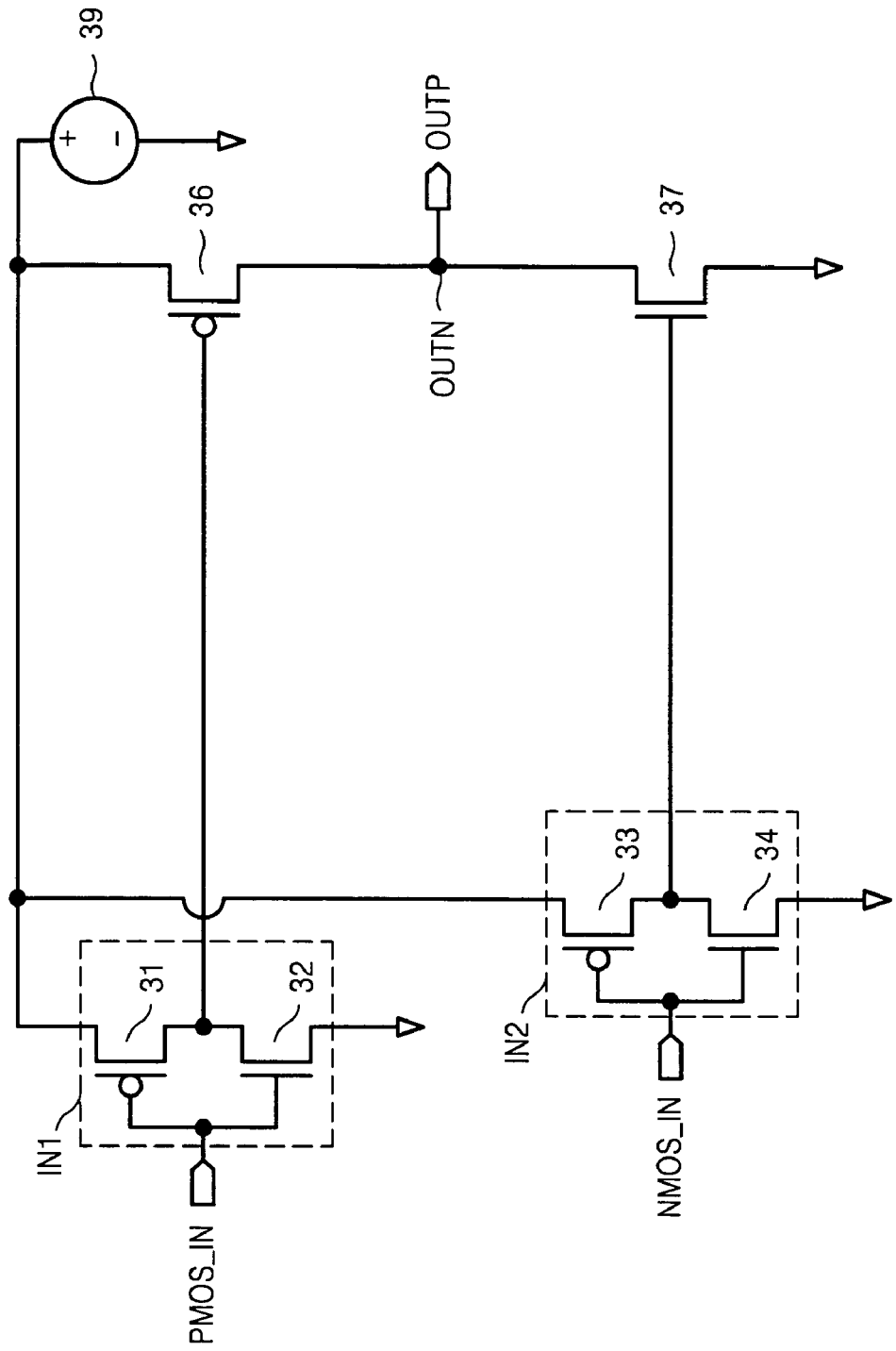
FIG. 1 is a circuit diagram of a conventional class-D amplifier.

Hereinafter, exemplary embodiments of the present invention will be described in detail with reference to the attached drawings. Like reference numerals in the drawings denote like elements.

Figure 2:
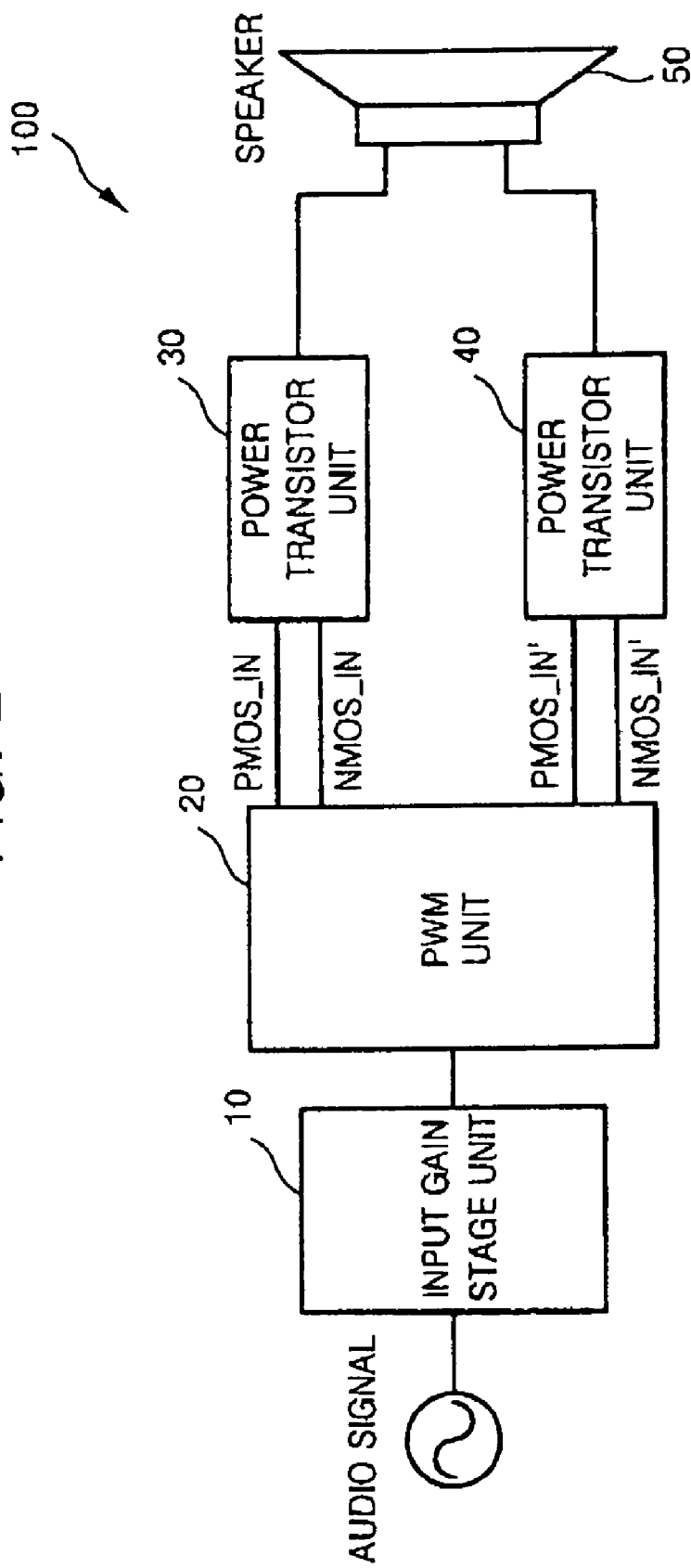
FIG. 2 is a block diagram of a power amplifier circuit according to an exemplary embodiment of the present invention.

FIG. 2 is a block diagram of a power amplifier circuit 100 according to an exemplary embodiment of the present invention. The power amplifier circuit 100 includes an input gain stage unit 10 receiving an audio signal, a pulse width modulation (PWM) unit 20, and a power transistor unit 30.

The audio signal is an analog signal and may be a signal of a typical audio device. The input gain stage unit 10 receives and amplifies the audio signal and may generate two output signals (first output signal and second output signal) having a phase difference of 180 degrees therebetween.

The PWM unit 20 includes a comparator type circuit (not shown). The PWM unit 20 compares each output signal (analog signal) of the input gain stage unit 10 with an internal reference signal. The PWM unit outputs a "1" when the analog signal is greater than the internal reference signal, and outputs a "0" when the analog signal is smaller than the internal reference signal, thereby generating pulse-width modulated (PWM) signals having a pulse waveform. The internal reference signal may be a triangle-wave signal or a sawtooth-wave signal.

The PWM unit 20 may generate PMOS input signal PMOS_IN and NMOS input signal NMOS_IN based on the first output signal of the input gain stage unit 10 and generate PMOS input signal PMOS_IN' and NMOS input signal NMOS_IN' based on the second output signal of the input gain stage unit 10.

An output terminal of the power amplifier circuit 100 is a full bridge terminal and includes two power transistor units 30 and 40 for generating high output power. Alternatively, only one power transistor unit 30 or 40 may be used. An output terminal including only one power transistor unit 30 or 40 is referred to as a half-bridge terminal. In the full-bridge terminal, the structures and the operations of the two power transistor units 30 and 40 are substantially the same. Thus, for clarity of the description, the operations of only one transistor, i.e., the power transistor unit 30 will be described.

The power transistor unit 30 receives the PMOS input signal PMOS_IN and the NMOS input signal NMOS_IN and sequentially drives a plurality of transistors in response to the input signals PMOS_IN and NMOS_IN to transmit a high-power output signal to a speaker 50.

Figure 3:
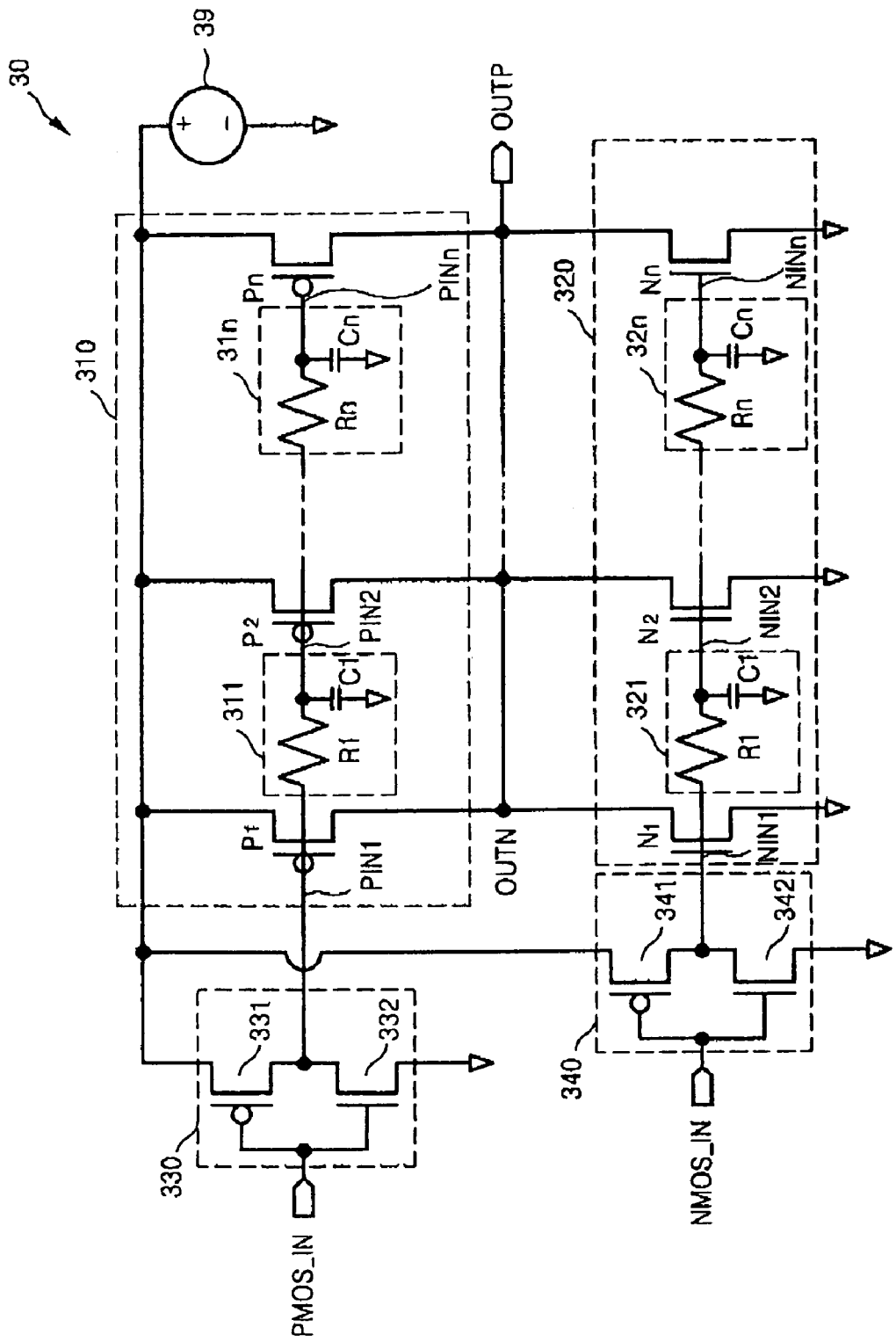
FIG. 3 is a circuit diagram of a power transistor unit according to an exemplary embodiment of the present invention.

FIG. 3 is a circuit diagram of the power transistor unit 30 according to an exemplary embodiment of the present invention. Referring to FIG. 3, the power transistor unit 30 includes a pull-up section 310, a pull-down section 320, a first inverter 330, and a second inverter 340. The pull-up section 310 includes first through n-th pull-up transistors P1 through Pn and first through n-th pull-up delay circuits 311 through 31$n$. The pull-down section 320 includes first through n-th pull-down transistors N1 through Nn and first through n-th pull-down delay circuits 321 through 32$n$. Each of the first through n-th pull-up transistors P1 through Pn may be a P-type transistor, i.e., a PMOS transistor. Each of the first through n-th pull-down transistors N1 through Nn may be an N-type transistor, i.e., an NMOS transistor.

The first through n-th pull-up transistors P1 through Pn are connected in parallel between a power supply node 39 and an output node OUTN and are turned on or off in response to first through n-th PMOS input signals PIN1 through PINn, respectively.

The first through n-th pull-down transistors N1 through Nn are connected in parallel between the power supply node 39 and the output node OUTN and are turned on or off in response to first through n-th NMOS input signals NIN1 through NINn, respectively.

The first inverter 330 includes a PMOS transistor 331 and an NMOS transistor 332. The first inverter 330 inverts a PMOS input signal PMOS_IN and generates the first PMOS input signal PIN1. The second inverter 340 includes a PMOS transistor 341 and an NMOS transistor 342. The second inverter 340 inverts an NMOS input signal NMOS_IN and generates the first NMOS input signal NIN1. The PMOS input signal PMOS_IN and the NMOS input signal NMOS_IN are output from the PWM 20 (FIG. 2) and are generated based on a pulse width modulated signal. The PMOS input signal PMOS_IN and the NMOS input signal NMOS_IN may be out of phase with one another.

The first through n-th pull-up delay circuits 311 through 31$n$ sequentially delay the first PMOS input signal PIN1, thereby generating the second through n-th PMOS input signals PIN2 through PINn with different delay times. The first through n-th pull-down delay circuits 321 through 32$n$ sequentially delay the first NMOS input signal NIN1, thereby generating the second through n-th NMOS input signals NIN2 through NINn with different delay times. While FIG. 3 illustrates that each delay circuit includes a resistor R and a capacitor C, the present invention is not restricted to this. Each delay circuit may include other delay elements. When the resistor R and the capacitor C are used, a delay time "τ" is determined as "RC".

The first and second inverters 330 and 340, the first through n-th pull-up delay circuits 311 through 31$n$, and the first through n-th pull-down delay circuits 321 through 32$n$ comprise a delay circuit unit for driving a plurality of the pull-up transistors P1 through Pn and a plurality of the pull-down transistors N1 through Nn with a predetermined time delay based on the pulse width modulated signal.

Figure 4:
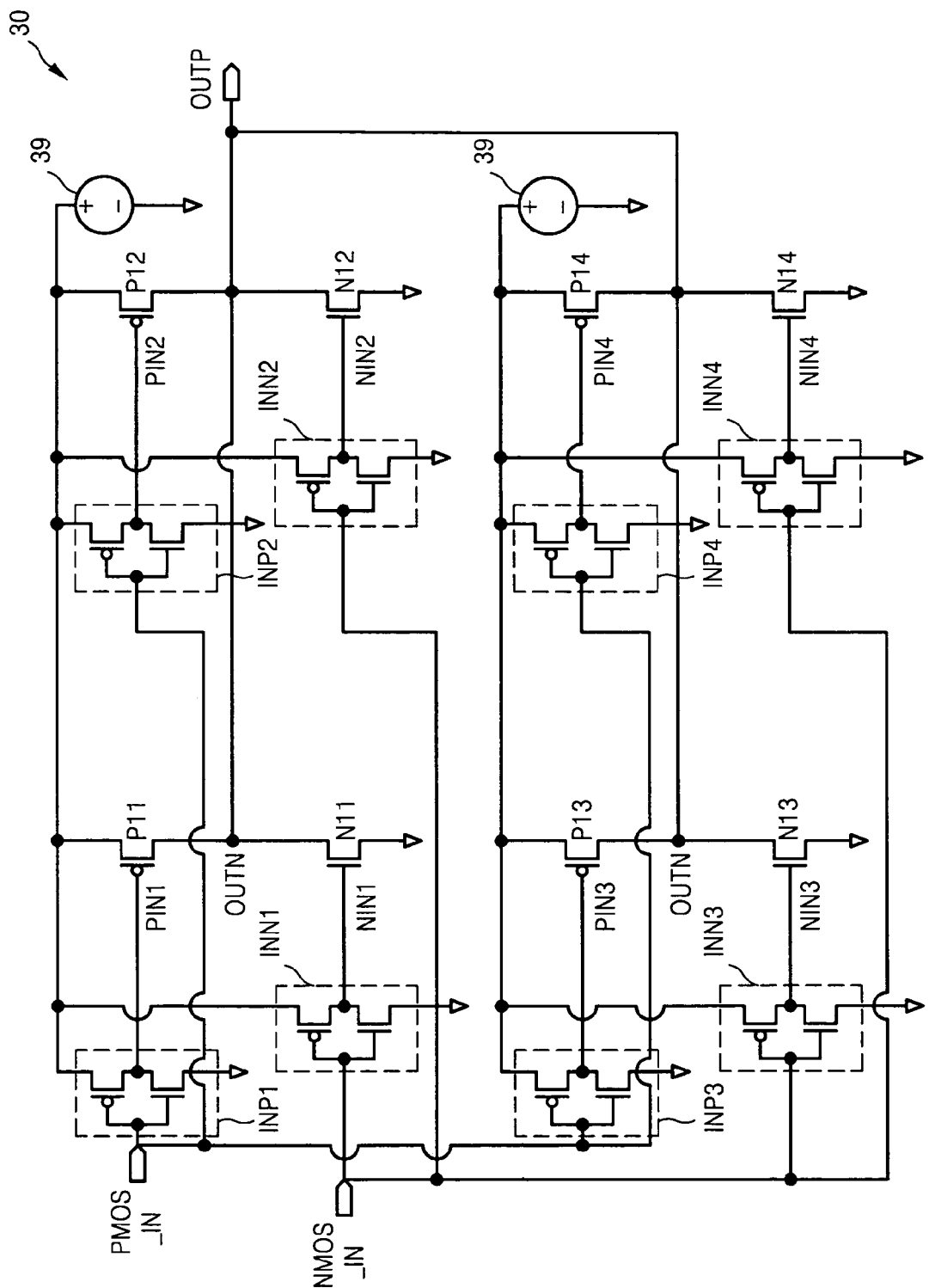
FIG. 4 is a circuit diagram of a power transistor unit according to an exemplary embodiment of the present invention.

FIG. 4 is a circuit diagram of the power transistor unit 30 according to an exemplary embodiment of the present invention. For clarity of the description, only first through fourth pull-up transistors P11 through P14, first through fourth pull-down transistors N11 through N14, first through fourth PMOS input inverters INP1 through INP4, and first through fourth NMOS input inverters INN1 through INN4 will be described below.

Referring to FIG. 4, the power transistor unit 30 includes the first through fourth pull-up transistors P11 through P14, the first through fourth pull-down transistors N11 through N14, the first through fourth PMOS input inverters INP1 through INP4, and the first through fourth NMOS input inverters INN1 through INN4.

The first through fourth pull-up transistors P11 through P14 are connected between the power supply node 39 and the output node OUTN. The first through fourth PMOS input inverters INP1 through INP4 receive and invert a PMOS input signal PMOS_IN, thereby generating first through fourth PMOS input signals PIN1 through PIN4. The first through fourth pull-up transistors P11 through P14 are turned on or off in response to the first through fourth PMOS input signals PIN1 through PIN4, respectively, input to their respective gates.

The first through fourth pull-down transistors N11 through N14 are connected between the output node OUTN and a ground node. The first through fourth NMOS input inverters INN1 through INN4 receive and invert an NMOS input signal NMOS_IN, thereby generating first through fourth NMOS input signals NIN1 through NIN4. The first through fourth pull-down transistors N11 through N14 are turned on or off in response to the first through fourth NMOS input signals NIN1 through NIN4, respectively, input to their respective gates.

Each of the first through fourth PMOS input inverters INP1 through INP4 includes a PMOS transistor and an NMOS transistor. The first through fourth PMOS input inverters INP1 through INP4 have different channel W/L ratios. The first PMOS input inverter INP1 has a greater W/L ratio than the second through fourth PMOS input inverters INP2 through INP4. The second through fourth PMOS input inverters INP2 through INP4 have W/L ratios, respectively, sequentially decreasing based on the W/L ratio of the first PMOS input inverter INP1. The first through fourth pull-up transistors P11 through P14 have the same W/L ratio and the first through fourth pull-down transistors N11 through N14 have the same W/L ratio.

Delay times are different according to the different W/L ratios of the first through fourth PMOS input inverters INP1 through INP4. A W/L ratio is in inverse proportion to a resistance (R). The turn-on resistance of the first through fourth PMOS input inverters INP1 through INP4 increases in order of INP1, INP2, INP3, and INP4. Accordingly, the first PMOS input inverter INP1, having a larger W/L ratio than any one of the second through fourth PMOS input inverters INP2 through INP4, outputs the first PMOS input signal PIN1 having a small resistance component. The first PMOS input signal PIN1 has less delay time than any of the second through fourth PMOS input signals PIN2 through PIN4. The first pull-up transistor P11 is turned on in response to the first PMOS input signal PIN1. When the first pull-up transistor P11 is turned on, it simultaneously pulls up the voltage of the power supply node 39 to the output node OUTN. The second PMOS input inverter INP2 has a W/L ratio less than that of the first PMOS input inverter INP1 and greater than those of the third and fourth PMOS input inverters INP3 and INP4. The second PMOS input inverter INP2 outputs the second PMOS input signal PIN2 delayed by a time corresponding to its W/L ratio. The second PMOS input signal PIN2 has a greater delay time than the first PMOS input signal PIN1. The second pull-up transistor P12 is turned on in response to the second PMOS input signal PIN2. The second pull-up transistor P12 pulls up the voltage of the power supply node 39 to the output node OUTN. The third and fourth PMOS input inverters INP3 and INP4 operate in the same manner. Thus, the pull-up voltages of the first through fourth pull-up transistors P11 through P14 are transmitted to the output node OUTN. The voltages of the first through fourth pull-up transistors P11 through P14 are summed at the output node OUTN, thereby generating an output voltage OUTP.

Similarly, the first through fourth NMOS input inverters INN1 through INN4 have the same W/L ratios as the first through fourth PMOS input inverters INP1 through INP4, respectively, and adjust delay times of the first through fourth NMOS input signals NIN1 through NIN4, respectively, according to their W/L ratios.

In an exemplary embodiment of the present invention, the first through fourth pull-up transistors P11 through P14 have the same W/L ratio and the first through fourth pull-down transistors N11 through N14 have the same W/L ratio. However, in other exemplary embodiments of the present invention, the first through fourth pull-up transistors P11 through P14 may have different W/L ratios, respectively, so that the first through fourth pull-up transistors P11 through P14 are sequentially turned on or off, and the first through fourth pull-down transistors N11 through N14 may have different W/L ratios, respectively, so that the first through fourth pull-down transistors N11 through N14 are sequentially turned on or off.

The first NMOS input inverter INN1 has the same W/L ratio as the first PMOS input inverter INP1. The first NMOS input inverter INN1 outputs the first NMOS input signal NIN1 delayed by a time corresponding to its W/L ratio. The first pull-down transistor N11 is turned on in response to the first NMOS input signal NIN1. The first pull-down transistor N11 pulls down the voltage of the output node OUTN to ground. The second NMOS input inverter INN2 has the same W/L ratio as the second PMOS input inverter INP2. The second NMOS input inverter INN2 outputs the second NMOS input signal NIN2 delayed by a time corresponding to its W/L ratio. The second pull-down transistor N12 is turned on in response to the second NMOS input signal NIN2. The second pull-down transistor N12 pulls down the voltage of the output node OUTN to the ground. The third and fourth NMOS input inverters INN3 and INN4 operate in the same manner. Thus, the voltages of the first through fourth pull-down transistors N11 through N14 at the output node OUTN are pulled down to the ground. The voltages of the first through fourth pull-down transistors N11 through N14 at the output node OUTN are discharged to the ground, thereby discharging the output voltage OUTP.

The first through fourth PMOS input inverters INP1 through INP4 and the first through fourth NMOS input inverters INN1 through INN4 comprise a delay circuit unit for driving a plurality of the pull-up transistors P11 through P14 and a plurality of the pull-down transistors N11 through N14 with a predetermined time delay based on the pulse width modulated signal.

Figure 5:
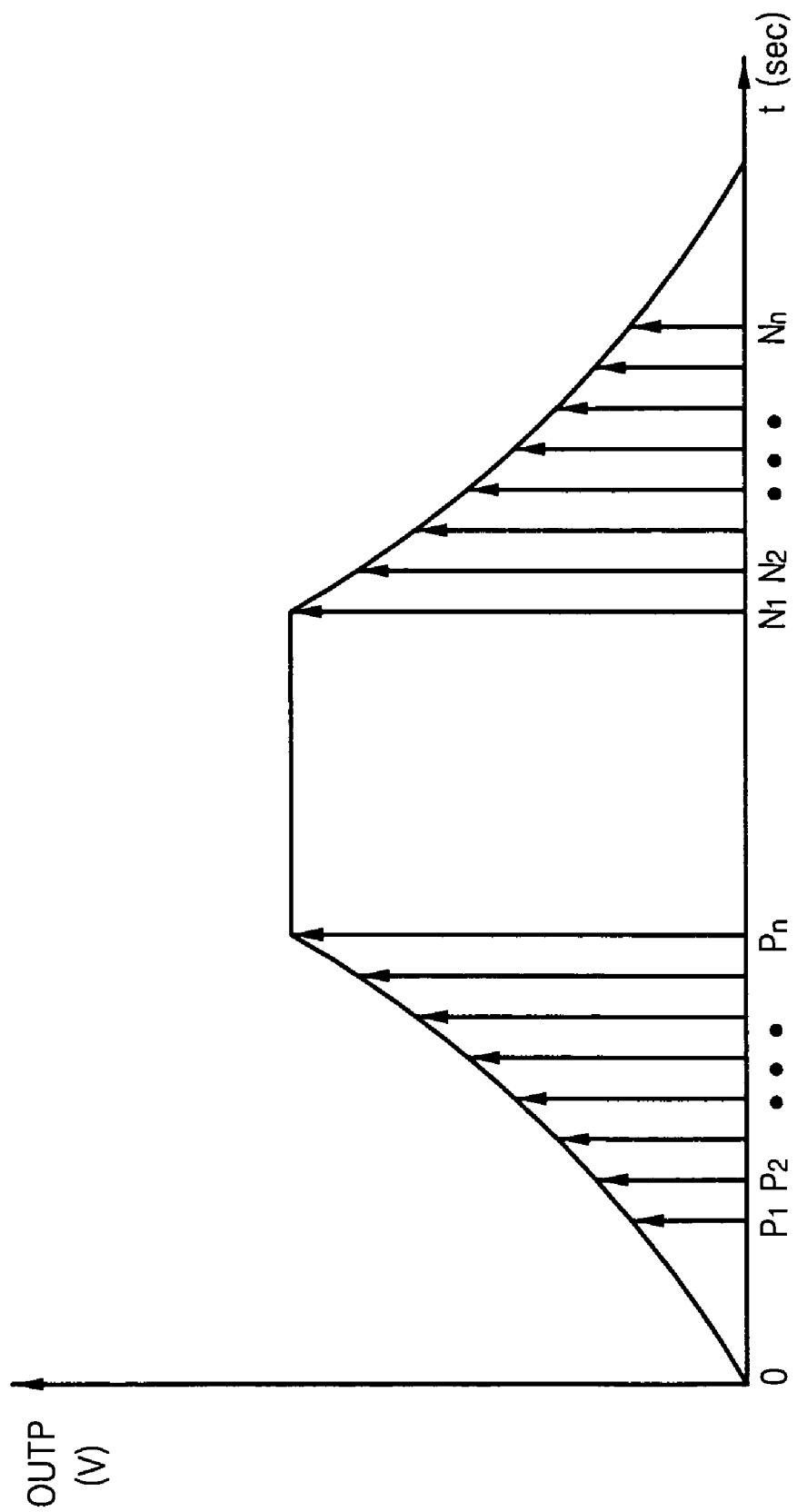
FIG. 5 is a graph of an output voltage of the power transistor unit illustrated in FIG. 3.

FIG. 5 is a graph of an output voltage OUTP of the power transistor unit 30 illustrated in FIG. 3. The graph illustrated in FIG. 5 shows the changes in the output voltage OUTP when the pull-up transistors P1 through Pn and the pull-down transistors N1 through Nn are turned on sequentially. The X-axis indicates a time at which each of the pull-up and pull-down transistors P1 through Pn and N1 through Nn is turned on and the Y-axis indicates a level of the output voltage OUTP.

The first pull-up transistor P1 receives the first PMOS input signal PIN1 and is turned on in response to the first PMOS input signal PIN1. The first delay circuit 311 delays the first PMOS input signal PIN1 by a predetermined time and outputs the second PMOS input signal PIN2. The second pull-up transistor P2 receives the second PMOS input signal PIN2 and is turned on in response thereto. In this way, the first through n-th pull-up transistors P1 through Pn respectively receive the first through n-th PMOS input signals PIN1 through PINn, which are respectively delayed by a predetermined time by the first through n-th delay circuits 311 through 31n, and are turned on.

Accordingly, each of the pull-up transistors P1 through Pn is turned on and an output current gradually and sequentially increases. As a result, the output voltage OUTP also gradually increases.

Similarly, the first pull-down transistor N1 receives the first NMOS input signal NIN1 and is turned on in response to the first NMOS input signal NIN1. The first delay circuit 321 delays the first NMOS input signal NIN1 by a predetermined time and outputs the second NMOS input signal NIN2. The second pull-down transistor N2 receives the second NMOS input signal NIN2 and is turned on in response thereto. In this way, the first through n-th pull-down transistors N1 through Nn respectively receive the first through n-th NMOS input signals NIN1 through NINn, which are respectively delayed by a predetermined time by the first through n-th delay circuits 321 through 32n, and are turned on.

Accordingly, each of the pull-down transistors N1 through Nn is turned on and an output current gradually and sequentially decreases. As a result, the output voltage OUTP also gradually decreases.

Figure 6:
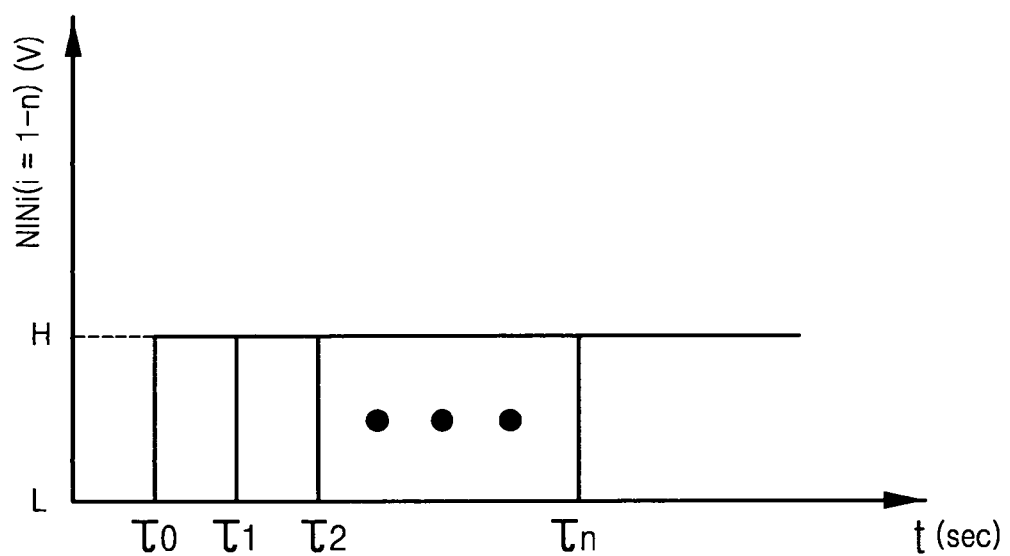
FIG. 6 is a graph of input signals of the power transistor unit illustrated in FIG. 3.

FIG. 6 is a graph of input signals of the power transistor unit 30 illustrated in FIG. 3. The graph shows a state where the first through n-th NMOS input signals NIN1 through NINn sequentially transition in the power transistor unit 30 from a low level L to a high level H over time.

When a transition point $\tau_0$ of the first NMOS input signal NIN1 is assumed as a reference time "0", $\tau_1, \tau_2, \ldots, \tau_n$ denote delay times, respectively, of the first through n-th delay circuits 321 through 32n. Each of the delay times $\tau_1, \tau_2, \ldots, \tau_n$ of the respective first through n-th delay circuits 321 through 32n is determined by a resistance and a capacitance R1 and C1, ..., or, Rn and Cn of a corresponding delay circuit.

Figure 7A:
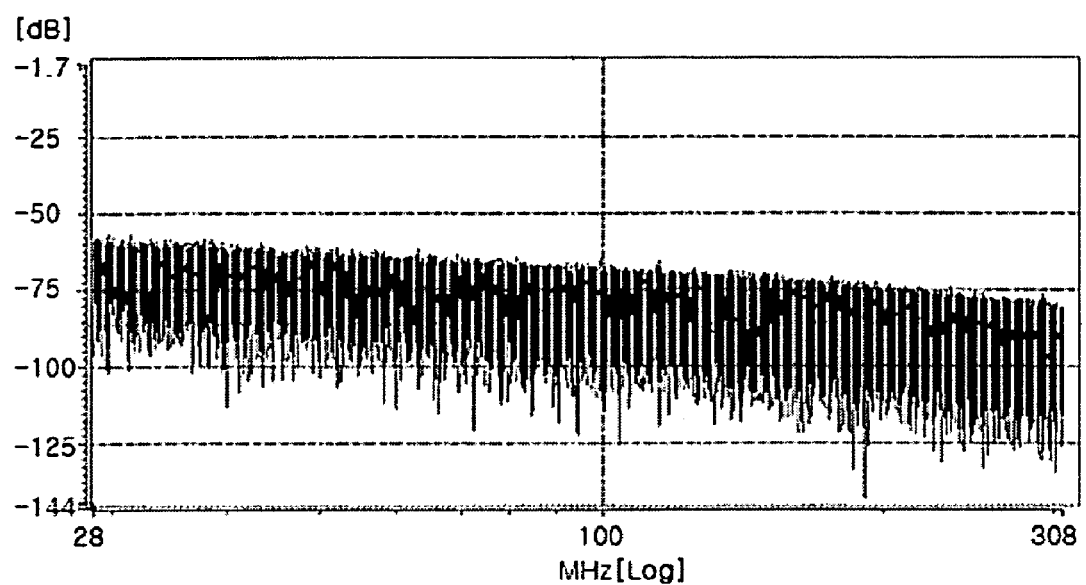
FIGS. 7A and 7B are graphs of the spectrum of an output signal in the prior art and the present invention, respectively.
Figure 7B:
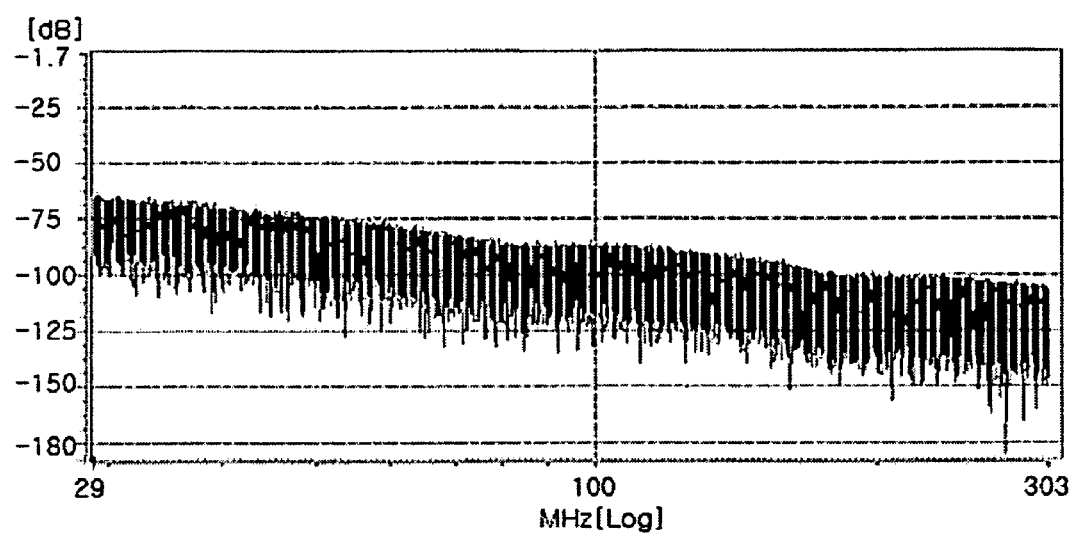

FIGS. 7A and 7B are graphs of the spectrum of an output signal in the prior art and the present invention, respectively. Referring to FIGS. 7A and 7B, the horizontal axis indicates a frequency (MHz) and the vertical axis indicates a dB value of the output voltage OUTP.

FIG. 7A is a graph of the frequency spectrum of an output signal in the prior art. According to the graph, a high-order harmonic frequency is large with respect to an output voltage waveform. Accordingly, output power rapidly changes with respect to input power, whereby electromagnetic interference (EMI) occurs.

FIG. 7B is a graph of the frequency spectrum of an output signal in the present invention. The high-order harmonic frequency of the output voltage OUTP illustrated in the graph of FIG. 7B is less than that illustrated in the graph of FIG. 7A. In the present invention, the output voltage OUTP is gradually and sequentially increased or decreased so that the output voltage OUTP has a small change in current. As a result, EMI is reduced.

While the present invention has been particularly shown and described with reference to exemplary embodiments thereof, it will be understood by those of ordinary skill in the art that various changes in form and details may be made therein without departing from the spirit and scope of the present invention as defined by the appended claims.

What is claimed is:

1. A power amplifier circuit comprising a power transistor unit generating an output signal based on a predetermined pulse-width modulated signal, wherein the power transistor unit comprises:
   first through n-th pull-up transistors connected in parallel between a first power supply node and an output node and responding to first through n-th PMOS input signals, respectively, where "n" is an integer greater than 1; and
   first through n-th pull-down transistors connected in parallel between the output node and a second power supply node and responding to first through n-th NMOS input signals, respectively,
   the first through n-th PMOS input signals are based on the pulse-width modulated signal and have different delay times, respectively, and
   the first through n-th NMOS input signals are based on the pulse-width modulated signal and have different delay times, respectively; and
   a delay circuit unit sequentially driving the plurality of transistors with a predetermined time delay based on the pulse-width modulated signal.

2. The power amplifier circuit of claim 1, wherein the pull-up transistors are sequentially turned on based on the pulse-width modulated signal and the pull-down transistors are sequentially turned on based on the pulse-width modulated signal.

3. The power amplifier circuit of claim 1, wherein the delay circuit unit comprises:
   first and second inverters inverting a PMOS input signal and an NMOS input signal, respectively, and generating the first PMOS input signal and the first NMOS input signal, respectively;
   a pull-up delay circuit delaying the first PMOS input signal and generating the second through n-th PMOS input signals; and
   a pull-down delay circuit delaying the first NMOS input signal and generating the second through n-th NMOS input signals, and
   the PMOS input signal and the NMOS input signal are based on the pulse-width modulated signal.

4. The power amplifier circuit of claim 1, wherein the delay circuit unit comprises:
   first through n-th PMOS input inverters inverting a PMOS input signal and generating the first through n-th PMOS input signals, respectively; and
   first through n-th NMOS input inverters inverting an NMOS input signal and generating the first through n-th NMOS input signals, respectively, and
   the PMOS input signal and the NMOS input signal are based on the pulse-width modulated signal.

5. The power amplifier circuit of claim 1, wherein the pulse-width modulated signal is an output signal of a pulse width modulation (PWM) unit that performs pulse width modulation on an analog signal.

6. A class-D power amplifier circuit comprising:
   a plurality of first group transistors sequentially turned on or off according to a PMOS input signal based on a predetermined pulse-width modulated signal; and
   a plurality of second group transistors sequentially turned on or off according to an NMOS input signal based on the predetermined pulse-width modulated signal.

7. The class-D power amplifier circuit of claim 6, wherein the PMOS input signal is out of phase with the NMOS input signal by a predetermined angle.

8. The class-D power amplifier circuit of claim 6, further comprising:
- a first group delay circuit generating a plurality of signals respectively having different delay times based on the PMOS input signal controlling the plurality of first group transistors; and
- a second group delay circuit generating a plurality of signals respectively having different delay times based on the NMOS input signal controlling the plurality of second group transistors.

9. The class-D power amplifier circuit of claim 6, further comprising a pulse width modulation (PWM) unit performing PWM on an analog signal to generate the predetermined pulse-width modulated signal.

10. The class-D power amplifier circuit of claim 9, wherein the PWM unit generates the predetermined pulse-width modulated signal having a pulse waveform based on a result of comparing the analog signal with a reference signal, and the reference signal is a triangle-wave signal or a sawtooth-wave signal.

11. A class-D power amplifier circuit comprising:
- an input gain stage unit receiving a predetermined signal and generating a first input signal and a second input signal;
- a pulse width modulation (PWM) unit performing PWM on the first input signal to generate first and second pulse-width modulated signals and performing PWM on the second input signal to generate third and fourth pulse modulated signals;
- a first power transistor unit comprising a plurality of first group transistors sequentially turned on or off according to the first pulse-width modulated signal and a plurality of second group transistors sequentially turned on or off according to the second pulse-width modulated signal, the first power transistor unit generating a first output signal; and
- a second power transistor unit comprising a plurality of third group transistors sequentially turned on or off according to the third pulse-width modulated signal and a plurality of fourth group transistors sequentially turned on or off according to the fourth pulse-width modulated signal, the second power transistor unit generating a second output signal.

12. The class-D power amplifier circuit of claim 11, wherein the first power transistor unit further comprises a first delay circuit unit generating signals for sequentially turning on or off the first group transistors based on the first pulse-width modulated signal and generating signals for sequentially turning on or off the second group transistors based on the second pulse-width modulated signal, and
the second power transistor unit further comprises a second delay circuit unit generating signals for sequentially turning on or off the third group transistors based on the third pulse-width modulated signal and generating signals for sequentially turning on or off the fourth group transistors based on the fourth pulse-width modulated signal.

13. The class-D power amplifier circuit of claim 11, wherein the first input signal is out of phase with the second input signal by 180 degrees.

* * * * *